(12) United States Patent
Kim

(10) Patent No.: US 7,482,256 B2
(45) Date of Patent: Jan. 27, 2009

(54) SEMICONDUCTOR DEVICE AND METHOD OF MANUFACTURING THE SAME

(75) Inventor: Yeong Sil Kim, Suwon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/023,845

(22) Filed: Dec. 27, 2004

(65) Prior Publication Data

US 2005/0139938 A1    Jun. 30, 2005

(30) Foreign Application Priority Data

Dec. 27, 2003    (KR) .................... 10-2003-0098371

(51) Int. Cl.
*H01L 21/3205* (2006.01)

(52) U.S. Cl. ............... 438/585; 257/E21.176

(58) Field of Classification Search ............ 257/412, 257/413, 388, E29.111, E21.158, E21.176; 438/585, 587, 588, 592

See application file for complete search history.

(56) References Cited

U.S. PATENT DOCUMENTS

| | | | |
|---|---|---|---|
| 6,323,093 B1 * | 11/2001 | Xiang et al. ............... 438/299 |
| 6,383,882 B1 | 5/2002 | Lee et al. | |
| 6,512,266 B1 * | 1/2003 | Deshpande et al. ......... 257/333 |
| 6,534,405 B1 | 3/2003 | Wu | |
| 6,767,814 B2 * | 7/2004 | Kwon et al. ................ 438/592 |
| 6,864,178 B1 | 3/2005 | Kim | |
| 6,878,598 B2 * | 4/2005 | Jun et al. .................... 438/303 |
| 2004/0175908 A1 * | 9/2004 | Ikematsu et al. ........... 438/592 |
| 2005/0064691 A1 * | 3/2005 | Kim .......................... 438/592 |

FOREIGN PATENT DOCUMENTS

KR    10-0320446 B1    12/2001

OTHER PUBLICATIONS

Chang Yong Kang and Dae Gwan Kang; Method for Manufacturing Silicide of Semiconductor Device; Korean Patent Abstracts; Date of Publication: Nov. 15, 2000; 1 Pg.; 2001 Korean Intellectual Property Office.

* cited by examiner

*Primary Examiner*—Lynne Gurley
*Assistant Examiner*—Colleen Matthews
(74) *Attorney, Agent, or Firm*—Andrew D. Fortney

(57) ABSTRACT

Provided is a semiconductor device capable of reducing the resistance of the gate electrode of a transistor. The semiconductor device comprises a semiconductor substrate, a gate oxide film formed on the substrate, a gate formed on the gate oxide film, and a metal silicide layer formed on the top surface and the upper side surface of the gate.

20 Claims, 6 Drawing Sheets

(Related Art)

SEMICONDUCTOR DEVICE AND METHOD OF MANUFACTURING THE SAME

BACKGROUND OF THE INVENTION (a) Field of the Invention

The present invention relates to a semiconductor device, and more particularly, to a transistor of a semiconductor device having a silicide layer and a method of manufacturing the same.

(b) Description of the Related Art

In general, a gate of a transistor in a semiconductor device includes a polysilicon layer. The gate electrode may further include a silicide layer formed on the polysilicon layer for decreasing the resistance of the gate.

Hereinafter, a conventional method of manufacturing a transistor will be described with reference to FIGS. 1A and 1B.

Referring to FIG. 1A, an isolation film 20 is formed in a semiconductor substrate 10 by a Shallow Trench Isolation (STI) process to define an active region. Then, a gate oxide film 30 is formed on an active region of the semiconductor substrate 10, a gate 40 including a polysilicon layer is formed thereon, and an insulating spacer 41 is formed on both side walls of the gate 40. Then, an oxide film 50 is deposited on the entire surface of the substrate 10, and a photoresist pattern 60 is formed on the oxide film 50 by a photolithography process so as to expose a region for forming silicide.

Referring to FIG. 1B, the oxide film 50 exposed by the photoresist pattern 60 is etched by a wet etching process using a wet chemical such as a hydrofluoric acid to expose the region for forming silicide. Here, the region for forming silicide is the upper surface of the gate 40 and a portion of the semiconductor substrate 10 adjacent to the spacer 41.

Then, the photo resist pattern 60 is removed by a well-known method not shown in the drawings, and a silicide layer is selectively formed on the silicide region by a silicidation process to reduce the resistance of the gate 40.

However, during the wet etching process of the oxide film 50, chemicals remain due to the characteristics of the wet etching process, which may especially cause a faster etching process at the interface between films. Therefore, as shown FIG. 1B, a portion 'A' in which silicidation has to be prevented is exposed, and the silicide layer is formed on the portion 'A'. Further, the lateral etching 'B' of the gate oxide film 30 under the gate 40 may cause to damage the gate oxide film 30. Electrical properties of the device are deteriorated by the above-mentioned problems, thereby decreasing the yield and the reliability of the device.

Further, only the upper surface of the gate 40 is exposed, such that the supply of silicon atoms from the gate 40 for silicidation is not always as great as might be desired. Accordingly, a desired thickness and range of the silicide layer formed on the upper surface of the gate 40 cannot always be obtained. As a result, it is sometimes difficult to reduce the resistance of the gate 40 to a desired value, such that the pattern shrink of the device is not as effective as might be desired.

SUMMARY OF THE INVENTION

The present invention is intended to solve the above-mentioned problems, and an object of the invention is to provide a semiconductor device capable of reducing a gate resistance of a transistor.

Further, another object of the present invention is to provide a method of manufacturing the semiconductor device.

To achieve the above-mentioned objects, a semiconductor device according to the present invention comprises a semiconductor substrate; a gate oxide film formed on the substrate; a gate formed on the gate oxide film; and a metal silicide layer formed on the top surface and the upper side surface of the gate.

According to a first aspect of the present invention, there is provided a method of manufacturing a semiconductor device, comprising the steps of: forming a gate oxide film on a semiconductor substrate; forming a gate on the gate oxide film; and forming a metal silicide layer on the top surface and the upper side surfaces of the gate.

According to a second aspect of the invention, there is provided a method of manufacturing a semiconductor device, comprising the steps of forming a gate stacked structure in which a gate oxide film, a gate, a first buffer layer and a hard mask layer are sequentially stacked on a semiconductor substrate; forming a second buffer layer on the entire surface of the semiconductor substrate so as to cover the gate stacked structure; forming a spacer on the second buffer layer of both sides of the gate stacked structure; forming an insulating layer on the entire surface of the semiconductor substrate; planarizing the insulating layer so as to expose the hard mask layer; removing the exposed hard mask layer; selectively removing a portion of the first buffer layer and the second buffer layer exposed by the removal of the hard mask layer to expose the top surface and the upper side surface of the gate; and forming a metal silicide layer on the exposed top surface and the upper side surface of the gate.

Here, the first buffer layer and the second buffer layer may comprise a silicon oxide (e.g., a layer of silicon dioxide), respectively, and the hard mask layer and the spacer may comprise silicon nitride, respectively.

Further, the planarizing step is performed so that the height of the insulating layer is lower than that of the hard mask layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE PREFERRED EMBODIMENTS

Now, exemplary embodiments of the present invention will be described with reference to the attached drawings. However, the present invention can be embodied in various modifications and thus is not limited to the embodiments described below.

FIGS. 2A to 2I are schematic sectional views for explaining a method of manufacturing a transistor of a semiconductor device according to an embodiment of the present invention.

Figure 1A:
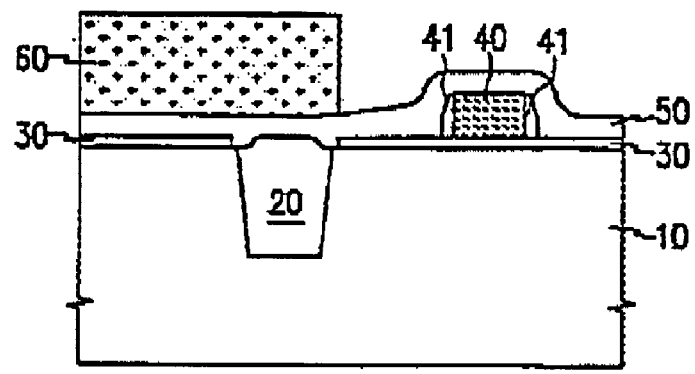
FIGS. 1A and 1B are schematic sectional views for explaining a conventional method of manufacturing a transistor of a semiconductor device.
Figure 1B:
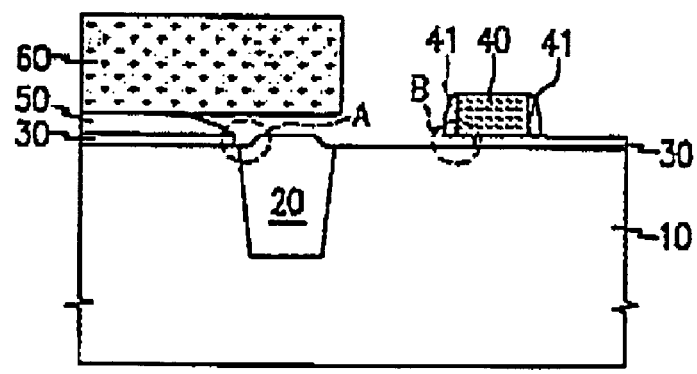
Figure 2A:
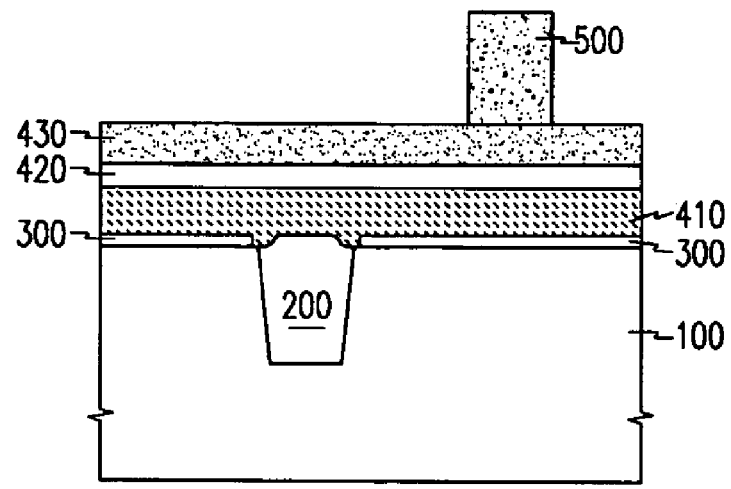
FIGS. 2A to 2I are schematic sectional views for explaining a method of manufacturing a transistor of a semiconductor device according to an embodiment of the present invention.

Referring to FIG. 2A, an isolation structure 200 is formed in a semiconductor substrate 100 by shallow trench isolation (STI) to define an active region, and a gate oxide film 300 is formed (e.g., by wet or dry thermal oxidation/growth) on the active region of the semiconductor substrate 100. Then, a polysilicon layer 410 is formed on the gate oxide film 300 as a gate material, and a first buffer layer 420 and a hard mask layer 430 are sequentially formed on the polysilicon layer 410. Here, the first buffer layer 420 comprises a silicon oxide layer (e.g., an undoped silicate glass [USG], a TEOS-based oxide, silicon dioxide doped with fluorine [FSG], boron [BSG], phosphorous [PSG], or both boron and phosphorous [BPSG], etc.), and the hard mask layer 430 comprises a silicon nitride layer.

Here, the polysilicon layer 410 has a thickness of about 260 Å to 1800 Å, the silicon oxide layer 420 has a thickness of about 150 Å to 300 Å, and the silicon nitride layer 430 has a thickness of about 1000 Å to 1500 Å.

The first buffer layer 420 is formed at an interface between the polysilicon layer 410 which is a gate material and the hard mask layer 430 which is a silicon nitride layer to relieve a stress caused by deposition of the silicon nitride layer. Specifically, the first buffer layer 420 reduces damage to the gate oxide film 300 and the polysilicon layer 410 caused by the stress of the hard mask layer 430.

The silicon oxide layer which is the first buffer layer 420 can be formed by a chemical vapor deposition (CVD) method or a plasma enhanced CVD (PE-CVD) method. In this case, it is preferable that the silicon oxide layer is formed by the CVD method to minimize damage to the gate oxide film 300 due to storage of electric charges or impurities. Similarly, it is also preferable that the silicon nitride layer as the hard mask layer 430 is formed by the CVD method.

Then, a photo resist pattern 500 is formed on the hard mask layer 430 by a photolithography process.

Figure 2B:
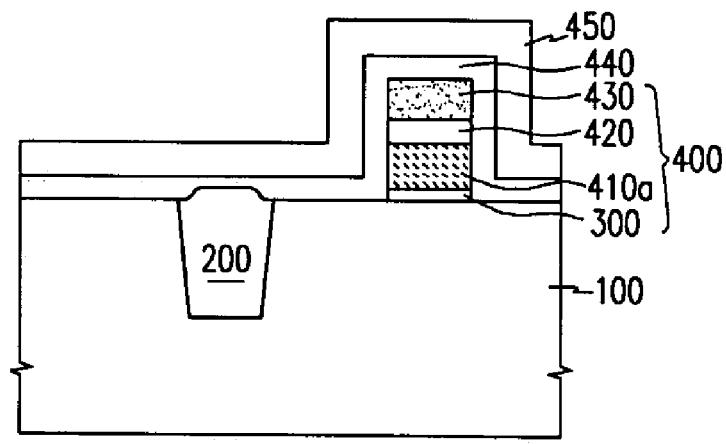

Referring to FIG. 2B, using a photoresist pattern 500 (refer to FIG. 2A), the hard mask layer 430, the first buffer layer 420, the polysilicon layer 410, and the gate oxide film 300 are sequentially etched by a dry etching process to thus form a gate stacked structure 400 comprising the hard mask layer 430, the first buffer layer 420, the gate 410a, and the gate oxide film 300. At this time, the first buffer layer 420 can be etched during the etching process of the hard mask layer 430, and the gate oxide film 300 can be etched during the etching process of the polysilicon layer 410. Various ion implanting processes (not shown in the drawings) can be performed to make conventional lightly doped drain (LDD) extensions and allow effective operation of the transistor.

Further, by a well-known method, the photoresist pattern 500 is removed, a second buffer layer 440 is formed over the entire surface of the substrate 100 so as to cover the gate stacked structure 400, and a silicon nitride layer 450 which has an etch selectivity to the second buffer layer 440 is formed as a spacer material.

Here, the second buffer layer 440 has a thickness of about 200 Å to 500 Å, and the silicon nitride layer 450 has a thickness of about 700 Å to 1500 Å. At this time, the width of a spacer is varied depending on the properties of a device and a desired circuit construction, such that the thickness of the silicon nitride layer 450 can be also varied depending on the desired width of the spacer.

Figure 2C:
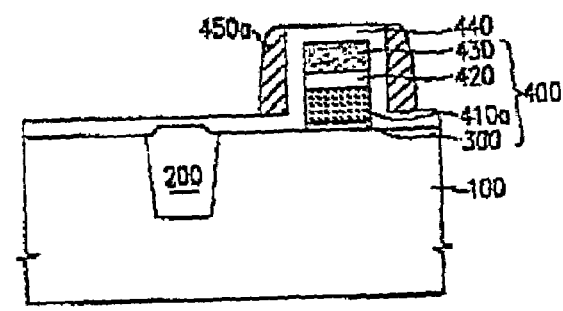

Referring to FIG. 2C, the silicon nitride layer 450 is etched by an anisotropic dry etching process (selective to second buffer layer 440) to form a spacer 450a on the second buffer layer 440 of both sides of the gate stacked structure 400. At this time, since the silicon nitride layer 450 is etched selectively to the second buffer layer 440, in the etching process, the second buffer layer 440 is used as an end point of the etching (a so-called "etch stop"). After formation of nitride spacers 450a, a source/drain ion implanting process (not shown in the drawings) can be performed (preferably through second buffer layer 440) to make conventional source and drain regions and allow effective operation of the transistor.

Figure 2D:
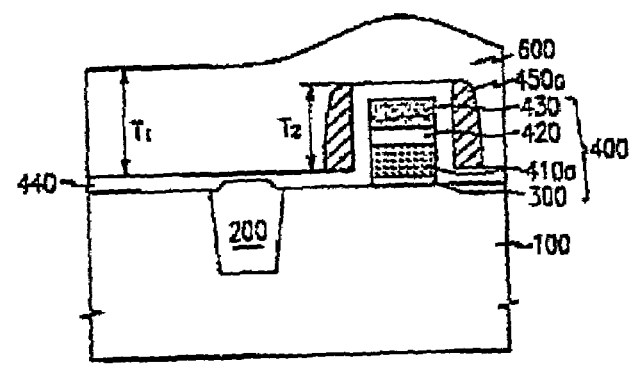

Referring to FIG. 2D, an insulating layer 600 is formed on the entire surface of the substrate 100 to fill gaps between the gate stacked structures 400. At this time, the thickness T1 of the insulating layer 600 is larger than the height T2 of the gate stacked structure 400 and the second buffer layer 440 combined. The insulating layer 600 may comprise a silicon oxide (e.g., a silicon dioxide layer, as described above).

Figure 2E:
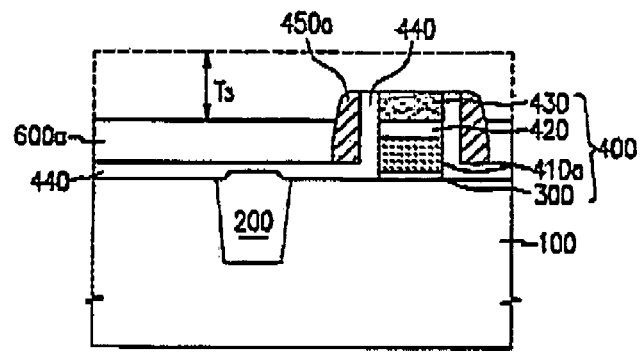

Referring to FIG. 2E, a planarization process is performed on the insulating layer 600 to reduce the thickness thereof. As shown in FIG. 2E, the planarization process may be performed by a chemical mechanical polishing (CMP) method or an etch-back method. Generally, in this planarization process, CMP includes overpolishing, and etch back includes overetching. Thus, the present planarization step polishes and/or removes a portion (thickness $T_3$) of the insulating layer 600. As a result, the height of the planarized insulating layer 600a becomes lower than the height of the gate stacked structure 400 (especially, the upper surface of insulating layer 600 is below the upper surface of the hard mask layer 430), such that the upper shoulder portion of the spacer 440/450a on both sides of the gate stacked structure 400 is exposed. Preferably, the difference in height between insulating layer 600 and nitride spacer 450a is about the thickness of hard mask layer 430, although this is not required for the present invention to provide its advantages.

For example, in a case where the planarization process is performed by the CMP method, first, a time polishing is performed to globally planarize the insulating layer 600, expose the hard mask layer 430, and overpolish the insulating layer 600. At this time, the polishing time is set so that a predetermined portion or thickness $T_3$ of the insulating layer 600 is removed by the CMP method. The etching process uses the hard mask layer 430 as an etching end point or etch stop, and includes an overetch. Preferably, etching comprises a dry plasma etching process or wet etching using a chemical such as (dilute) aqueous HF or buffered aqueous HF (a so-called "buffered oxide etch").

Further, by using the hard mask layer 430 as a polishing end point, the CMP on the insulating layer 600 may be performed so as to expose the hard mask layer 430. In this case, it is preferable that the height of the finally-polished insulating layer 600a is lower than that of the hard mask layer 430 to expose the upper shoulder portion of the spacer 450a. Thus, even if insulator layer 600 is time polished, it may be overpolished by a predetermined length of time sufficient to reduce its height to a level below the height of spacer 450a.

On the other hand, in a case where the planarization process is performed by the etch-back method, the hard mask layer 430 may be used as an etching end point or etch stop. In this case, the etching process needs to provide etching selectivity between the silicon nitride layer constituting the hard mask layer 430 and the insulating layer 600. However, in either the CMP or the etch-back case, exposure of the hard mask layer 430 can be detected by a number of endpoint detection means (e.g., reflectance, refraction/refractance, motor current in the case of CMP, etc.), and the overpolishing or overetching can be timed from the hard mask detection point.

After planarizing the insulating layer 600, openings can be formed in the insulating layer 600 (not shown) and buffer oxide layer 440, and a silicide-forming metal (e.g., as described below) may be deposited in the openings and annealed to form conventional a silicide layer (not shown) on the source and drain.

Figure 2F:
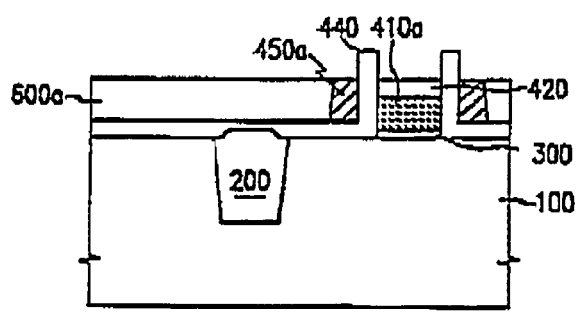

Referring to FIG. 2F, the hard mask layer 430 is selectively removed using the insulating layer 600a and the first and second buffer layers 420 and 440 as an etching barrier (or etch stop). At this time, since the spacer 450a is formed of the same material (e.g., silicon nitride) as the hard mask layer 430, the top shoulder portion of the spacer 450a is removed, so that the height of the spacer 450a is lowered. Preferably, after this selective etching, the spacer 450a has a height equal to or similar to that of the planarized insulating layer 600a. Since the gate oxide film 300 is not exposed due to the second buffer layer 440 and is thus protected from wet etching, the gate oxide film 300 is not damaged. Preferably, the wet etching process is performed using an etchant such as a hot phosphoric acid.

On the other hand, the selective removal of the hard mask layer 430 may be performed using a chemical dry etch (CDE) method. In this case, when a combination of (1) a fluorine-based gas such as carbon tetrafluoride ($CF_4$), sulfur hexafluoride ($SF_6$) and/or nitrogen trifluoride ($NF_3$), and (2) an additive gas such as oxygen ($O_2$), nitrogen ($N_2$), argon (Ar) and/or helium (He) is used as the etching gas, an etch selectivity of silicon nitride to silicon oxide can be from one to several tens (e.g., at least 30-40) or more. Thus, there is an advantage that thickness control of the insulating layer 600a can be easily performed.

Figure 2G:
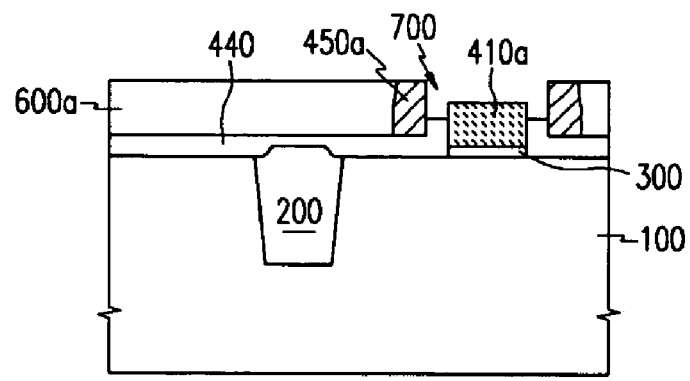

Referring to FIG. 2G, the first buffer layer 420 is selectively removed by a wet etching process using an etchant including a (buffered) hydrofluoric acid diluted with pure (distilled and/or deionized) water. Alternatively, the selective removal of the first buffer layer 420 can be performed by the CDE method using a combination of (1_fluorine-based gas such as carbon tetrafluoride ($CF_4$), sulfur hexafluoride ($SF_6$) or nitrogen trifluoride ($NF_3$), and (2) an additive gas such as oxygen ($O_2$), nitrogen ($N_2$), argon (Ar) and/or helium (He). In this case, it is preferable that the etch selectivity of silicon nitride to silicon oxide is controlled to one to several or several tens (e.g., from 3:1, 5:1 or 10:1 to about 50:1 or about 100:1, etc.).

At this time, since the second buffer layer 440 comprises the same silicon oxide as the first buffer layer 420, during the selective removal of the first buffer layer 420, the second buffer layer 440 is partially removed and a groove 700 is formed between the gate 410a and the spacer 450a (e.g., during an overetch of first buffer layer 420). Thus, the upper side surface of the gate 410a is partially exposed.

Figure 2H:
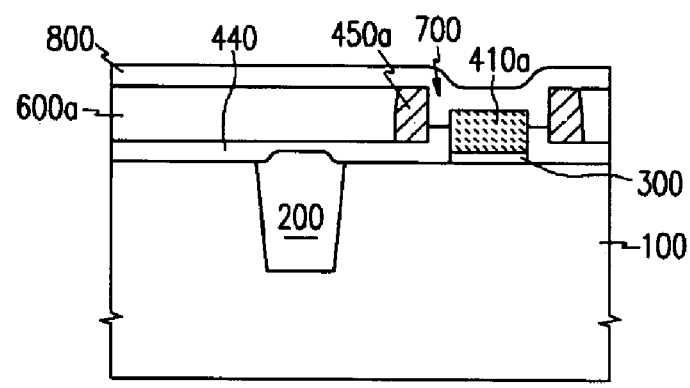

Referring to FIG. 2H, a metal layer 800 is formed on the entire surface of the substrate 100 so as to fill the groove 700. The metal layer 800 is heated or annealed to form a metal silicide layer by a silicide reaction with silicon, preferably, with the polysilicon of gate 410a. At this time, the metal layer 800 is in contact with the upper side surfaces as well as the top surface of the gate 410a.

The metal layer 800 may comprise one or more metals or metal-based materials such as titanium (Ti), titanium nitride (TiN), cobalt (Co), nickel (Ni), platinum (Pt), molybdenum (Mo) and/or tungsten (W). Specifically, any metal or metal material capable of forming a metal silicide may be used for the metal layer 800. Therefore, a range of selected processes becomes wider. This is because the silicide reaction is performed by depositing the metal layer 800 after forming the insulating layer 600a on the gate 410, such that it is possible to perform the silicide reaction without damaging the gate oxide film 300 or the active region of the semiconductor substrate 100.

Figure 2I:
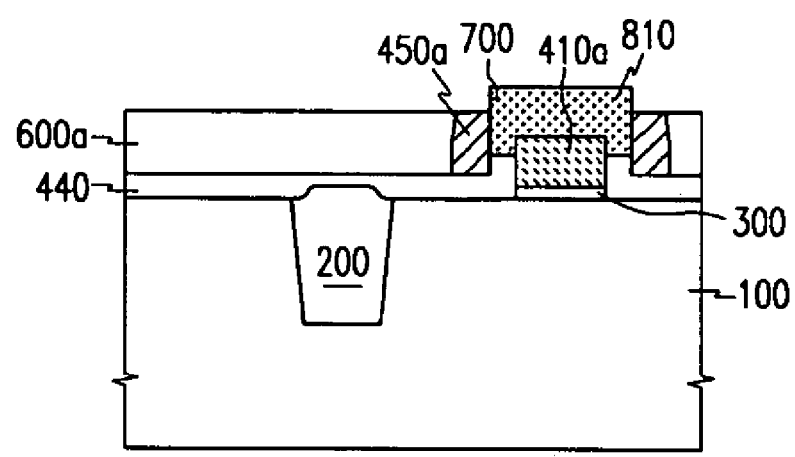

Referring to FIG. 2I, a metal silicide layer 810 is formed on the top surface and the upper side surfaces of the gate 410a by thermal-treating (e.g., heating or annealing) the metal layer 800. At this time, the silicide forms by a self aligned silicide (salicide) process. Then, the remaining metal layer 800 which does not participate in the silicide reaction is selectively removed.

Specifically, since the metal layer 800 fills the groove 700, the metallic layer 800 contacts the upper side surface of the gate electrode 410a. Therefore, the metal silicide layer 810 is formed on the upper side surfaces of the gate 410a by the silicidation reaction. Accordingly, the gate 410a and the metal silicide layer 810 have a 'T' shape.

Since the metal silicide layer 810 has a greater thickness and area than that of a conventional process which forms a silicide layer only on the top surface of the gate polysilicon, it is possible to reduce the line resistance properties of the polysilicon gate 410a, thereby improving the electrical properties of a device. Further, with development of a fine patterning technique, it is possible to avoid problems that may arise when the operation of a device is obstructed by a short-circuit between the active region and the gate at the time of forming the silicide.

As described above, the silicide layer is selectively formed on the top and upper side surfaces of the gate electrode, such that it is possible to basically prevent the active region from being damaged. Further, it is possible to basically prevent the gate oxide film from being damaged due to wet etching oxide layer(s) over the source and drain (active) regions of the substrate.

Further, the metal layer used to form the silicide layer can be selected from various metals and metal materials. Therefore, the range of silicide processes can be wider. Since the silicide layer is formed on the upper side surfaces of the gate as well as the top surface of the gate, so that the gate and the silicide layer have 'T' shape, the line resistance properties of the gate may be improved, thereby enabling enhancement of the electrical properties of the device.

While the present invention has been particularly shown and described with reference to exemplary embodiments thereof, it will be understood by those skilled in the art that various changes in form and details may be made therein without departing from the sprit and scope of the invention as defined by the appended claims.

What is claimed is:

1. A method of manufacturing a semiconductor device, comprising steps of:
    forming a gate structure in which a gate oxide film, a gate, a first buffer layer and a hard mask layer are sequentially deposited on a semiconductor substrate;
    forming a second buffer layer of a same material as the first buffer layer on the entire surface of the semiconductor substrate so as to cover a top surface and side surfaces of the gate structure;
    forming a spacer above the second buffer layer on sides of the gate structure without removing a part of the second buffer layer;
    forming an insulating layer on the entire surface of the semiconductor substrate including the second buffer layer;
    planarizing the insulating layer sufficiently to remove a first portion of the second buffer layer and expose the hard mask layer;
    removing the exposed hard mask layer and a portion of the spacer;
    selectively removing a portion of the first buffer layer exposed by the removal of the hard mask layer and a second portion of the second buffer layer to expose the top surface and the upper side surface of the gate and form an opening between the gate and the spacer; and forming a metal silicide layer on the exposed top and upper side surfaces of the gate in the opening.

2. The method of claim 1, wherein the first buffer layer and the second buffer layer each comprise a silicon oxide.

3. The method of claim 2, wherein the hard mask layer and the spacer each comprise silicon nitride.

4. The method of claim 1, wherein the planarizing step is performed so that the insulating layer has a height that is lower than that of the hard mask layer.

5. The method of claim 4, wherein the planarizing comprises (i) chemical mechanical polishing using a time polishing or the hard mask as an etching end point, or (ii) etching back using the hard mask layer as the etching end point.

6. The method of claim 1, wherein the metal silicide layer comprises a silicide of any one of titanium (Ti), titanium nitride (TiN), cobalt (Co), nickel (Ni), platinum (Pt), and tungsten (W).

7. The method of claim 1, wherein the gate has a thickness of from about 260 Å to 1800 Å.

8. The method of claim 7, wherein the first buffer layer has a thickness of from about 150 Å to 300 Å.

9. The method of claim 8, wherein the hard mask layer has a thickness of from about 1000 Å to 1500 Å.

10. The method of claim 7, wherein the hard mask layer has a thickness of from about 1000 Å to 1500 Å.

11. The method of claim 1, further comprising ion implanting source and drain regions after formation of the spacer on the second buffer layer.

12. The method of claim 1, wherein the insulating layer comprises a silicon oxide.

13. The method of claim 1, wherein removing the hard mask layer comprises dry etching with a fluorine based gas and an additive gas comprising oxygen, nitrogen, and/or helium.

14. The method of claim 13, wherein removing the first buffer layer comprises a wet etching process using dilute hydrofluoric acid.

15. The method of claim 13, wherein removing the first buffer layer comprises dry etching with a fluorine based gas and an additive gas comprising oxygen, nitrogen, and/or helium.

16. The method of claim 1, wherein removing the first buffer layer comprises a wet etching process using dilute hydrofluoric acid.

17. The method of claim 1, wherein removing the first buffer layer comprises dry etching with a fluorine based gas and an additive gas comprising oxygen, nitrogen, and/or helium.

18. The method of claim 3, wherein the etch selectivity of silicon nitride to silicon oxide is from about 3:1 to 100:1.

19. The method of claim 1, wherein forming said metal silicide comprises depositing a metal on said gate, remaining portions of said first buffer layer and said second buffer layer, and said insulating layer, and heating or annealing to form said metal silicide.

20. The method of claim 19, wherein said metal silicide is formed only on the exposed top and upper surfaces of said gate.

* * * * *